(12) United States Patent
Wenski et al.

(10) Patent No.: US 6,514,424 B2
(45) Date of Patent: Feb. 4, 2003

(54) PROCESS FOR THE DOUBLE-SIDE POLISHING OF SEMICONDUCTOR WAFERS AND CARRIER FOR CARRYING OUT THE PROCESS

(75) Inventors: Guido Wenski, Burghausen (DE); Gerhard Heier, Burghausen (DE); Wolfgang Winkler, Tittmoning (DE); Thomas Altmann, Haiming (DE)

(73) Assignee: Wacker Siltronic Gesellschaft für Halbleitermaterialien AG, Burghausen (DE)

( * ) Notice: Subject to any disclaimer, the term of this patent is extended or adjusted under 35 U.S.C. 154(b) by 119 days.

(21) Appl. No.: 09/826,135

(22) Filed: Apr. 4, 2001

(65) Prior Publication Data

US 2001/0047978 A1 Dec. 6, 2001

(30) Foreign Application Priority Data

May 11, 2000 (DE) .......................... 100 23 002

(51) Int. Cl.$^7$ .......................... H01L 21/00; B44C 1/22
(52) U.S. Cl. ...................... 216/38; 156/345.14; 216/88; 438/692; 438/745
(58) Field of Search .............................. 216/38, 88, 89, 216/91; 438/692, 693, 745; 156/345.12, 345.14; 451/278, 279, 285, 287

(56) References Cited

U.S. PATENT DOCUMENTS

| | | |
|---|---|---|
| 3,691,694 A | 9/1972 | Goetz et al. |
| 5,422,316 A | 6/1995 | Desai et al. |
| 5,914,053 A | 6/1999 | Masumura et al. |
| 6,042,688 A | 3/2000 | Masumura et al. |

FOREIGN PATENT DOCUMENTS

| | | |
|---|---|---|
| DE | 69004275 | 11/1993 |
| DE | 199 05 737 | 12/2000 |
| EP | 0 197 214 | 10/1986 |
| EP | 0 208 315 | 9/1990 |
| EP | 0 379 214 | 11/1993 |
| EP | 0 887 152 | 12/1998 |

OTHER PUBLICATIONS

English Derwent Abstract AN 1987–008979 [O2] corresponding to EPO208315.
E. Mendel and J. R. Hause, IBM Technical Report TR 22.2342.
English Derwent Abstract AN 2000–579981 [55] corresponding to DE 199 05 737.

*Primary Examiner*—William A. Powell
(74) *Attorney, Agent, or Firm*—Collard & Roe, P.C.

(57) ABSTRACT

A process for the double-side polishing of semiconductor wafers between two polishing plates which rotate in opposite directions and are covered with polishing cloth, so that at least 2 μm of semiconductor material is removed. The semiconductor wafers lay in plastic-lined cutouts in a set of a plurality of planar carriers which are made from steel and the mean thickness of which is 2 to 20 μm smaller than the mean thickness of the fully polished semiconductor wafers. The set comprises only those carriers whose difference in thickness is at most 5 μm, and each carrier belonging to the set has at least one unambiguous identification feature which assigns it to the set. An item of information contained in the identification feature is used in order for the plastic linings to be exchanged at fixed intervals and to ensure that the semiconductor wafers remain in the same order after the polishing as before the polishing. There is also a carrier which is suitable for carrying out the process.

14 Claims, 3 Drawing Sheets

PROCESS FOR THE DOUBLE-SIDE POLISHING OF SEMICONDUCTOR WAFERS AND CARRIER FOR CARRYING OUT THE PROCESS

BACKGROUND OF THE INVENTION

1. Field of the Invention

The present invention relates to a process for the double-side polishing of semiconductor wafers using improved carriers.

2. The Prior Art

A process for the double-side polishing of semiconductor wafers between a plurality of upper polishing heads and a lower polishing plate, which each rotate, is described in U.S. Pat. No. 3,691,694. In this case, one plastic mask per polishing head is used to hold semiconductor wafers, which mask is attached to a guide ring which is separately rotated. E. Mendel and J. R. Hause, in *IBM Technical Report* TR22.2342, presented at the Spring Meeting of the Electrochemical Society in Boston, Mass. on May 10, 1979, propose, for double-side polishing, carriers which are made from fiber-reinforced plastics. These carriers have cutouts for holding semiconductor wafers and external teeth, by means of which they are set in free rotary movement between two polishing plates rotating in opposite directions by an outer ring and an inner ring. There are serious drawbacks to these plastic carriers which are their short service life and the risk of the semiconductor wafers breaking during polishing.

Therefore, carriers made from metal, for example steel, have been developed for double-side polishing. These carriers, in order to protect the edge of the semiconductor wafer, according to an embodiment described in EP 208 315 B1, have plastic-lined cutouts for holding the semiconductor wafers. The linings are secured either by bonding in plastic rings or by injecting plastic into the cutouts and punching out the openings for the semiconductor wafers. Both procedures fail to provide permanent stability of the linings. Plastic linings of this type are even more delicate in long-term use if, in accordance with EP 197 214 A2, they are simply inserted into the cutouts in the carriers.

Further developments of carriers for this application include the incorporation of abrasion-limiting means, for example made from steel or sintered carbides (U.S. Pat. No. 5,422,316), and of parts for dressing or conditioning the polishing cloth during the polishing, for example grinding bodies or brushes (EP 887 152 A2). It is also possible to provide a lining of the cutouts with a profiled device for simultaneous polishing of the edges of the semiconductor wafers (U.S. Pat. No. 5,914,053). In everyday operation, for numerous reasons, for example the occurrence of polishing scratches, the adverse affect on the geometry values of the semiconductor wafers and the lack of stability in long-term use, the use of carriers of this type has proven impossible.

To achieve the high local planarities required for modern processes for the fabrication of electronic semiconductor components, for example the distortion-free application of photomasks, a process for double-side polishing of semiconductor wafers has been developed which is described in German Patent Application Serial Number DE 199 05 737.0 and relates to a tight window of from 2 $\mu$m to 20 $\mu$m for the thickness difference between fully polished semiconductor wafer and carrier. With this process, it is possible to achieve semiconductor wafers with local planarity values, expressed as $SFQR_{max}$ for a grid with device areas of 25 mm×25 mm, of less than or equal to 0.13 $\mu$m. These local planarity values are required for semiconductor component processes with line widths of less than or equal to 0.13 $\mu$m. In a preferred embodiment, plastic-lined steel carriers are used.

A drawback which is common to all the processes of the prior art is that it is impossible to fabricate the semiconductor wafers in accurate seuence, as required by the industry. In this context, a person skilled in the art understands the term "fabrication in accurate sequence" to mean that the sequence of wafers produced by sawing a crystal into a multiplicity of semiconductor wafers is maintained during the further processing all the way through to the end product. The practice which is sometimes used of scratching or imprinting identification features into the carriers for double-side polishing has not proven effective, since it leads to local deformation of the carriers. This in turn has the consequence that the geometry of the polished semiconductor wafers, in particular the planarity, is impaired. Also there is a risk of the semiconductor wafers being scratched during the polishing.

SUMMARY OF THE INVENTION

Therefore, it is an object of the present invention to provide a process for the double-side polishing of semiconductor wafers, operating in accurate sequence, with $SFQR_{max}$ values of less than or equal to 0.13 $\mu$m, in which carriers with a long service life are used.

The above object is achieved according to the present invention by providing a process for the double-side polishing of semiconductor wafers between two polishing plates which rotate in opposite directions and are covered with polishing cloth, so that at least 2 $\mu$m of semiconductor material is removed, and with the semiconductor wafers lying in plastic-lined cutouts in a set of a plurality of planar carriers which are made from steel and the mean thickness of which is 2 to 20 $\mu$m smaller than the mean thickness of the fully polished semiconductor wafers, wherein the set comprises only those carriers whose difference in thickness is at most 5 $\mu$m, and each carrier belonging to the set has at least one unambiguous identification feature which assigns it to the set, and an item of information contained in the identification feature is used in order for the plastic linings to be exchanged at fixed intervals and to ensure that the semiconductor wafers remain in the same order after the polishing as before the polishing.

A significant feature of the invention is that each of the steel carriers, which have been produced in highly planar form, has at least one unambiguous identification feature which allows the semiconductor wafers to be handled in accurate sequence without the polishing results being adversely affected. A further significant feature of the invention is that the plastic linings of the cutouts in the carriers for holding the semiconductor wafers are replaced at fixed intervals, preferably periodically, which considerably increases the service life of the carriers and prevents damage to the edges of the semiconductor wafers.

The starting product for the process is semiconductor wafers which in a known way have been separated from a crystal, edge-rounded and lapped, ground and/or etched. If desired, the edges of the semiconductor wafers may be polished.

The end product of the process is semiconductor wafers which are in the same order as before polishing, satisfy the requirements imposed on semiconductor wafers to be used as starting material for semiconductor component processes with line widths of less than or equal to 0.13 $\mu$m and are superior to the semiconductor wafers produced according to the prior art in terms of their fabrication costs.

The process according to the invention can be used for the double-side polishing of various types of disk-like bodies which consist of a material which can be machined by a polishing process. Examples of materials of this type are glass materials, for example silica-based, and semiconductors, for example silicon, silicon/germanium and gallium arsenide. In the context of the invention, silicon in single-crystal form for further use in the fabrication of electronic components, for example processors and memory elements, is particularly preferred.

The process is particularly suitable for the fabrication of silicon wafers with diameters of greater than or equal to 200 mm and thicknesses of from 500 $\mu$m to 1000 $\mu$m. The semiconductor wafers may either be used directly as starting material for the fabrication of semiconductor components or, after a polishing step has been carried out in order to produce a haze-free surface and/or after the application of layers such as back-surface seals or an epitaxial coating of the wafer front surface and/or after conditioning by a heat treatment, are supplied for their intended purpose. In addition to the fabrication of wafers from a homogeneous material, the invention may, of course, also be used for the production of semiconductor substrates of multilayer construction, such as SOI (silicon-on-insulator) wafers.

The process will be described further on the basis of the example of the polishing of semiconductor wafers.

In principle, it is possible to subject a number of silicon wafers, which have been sawn by means of an annular sawing or wire sawing process, to the double-side polishing step according to the invention directly. However, it is preferable for the sharply delimited and therefore mechanically highly sensitive wafer edges to be rounded with the aid of a suitably profiled grinding wheel. Furthermore, to improve the geometry and in some cases remove the destroyed crystal layers, it is preferable for the silicon wafers to be subjected to abrasive steps such as lapping and/or grinding and/or etching, in order to reduce the abrasion of material in the polishing step according to the invention. Double-side sequential surface grinding with from 10 $\mu$m to 50 $\mu$m of silicon being removed from each side, followed by an acid etching step in a mixture of concentrated aqueous nitric acid and concentrated aqueous hydrofluoric acid with from 5 $\mu$m to 20 $\mu$m of silicon being removed from each side and polishing of the edge of the semiconductor wafers, is particularly preferred. All of the abovementioned steps are carried out in accordance with the prior art.

To carry out the polishing step according to the invention, it is possible to use a commercially available machine for double-side polishing which is of suitable size and which allows the simultaneous polishing of at least three silicon wafers using at least three carriers. The simultaneous use of from four to six carriers, which each hold at least three silicon wafers arranged at regular intervals on a circular path, is particularly preferred. The polishing machine substantially comprises a lower polishing plate which can rotate freely in the horizontal plane and an upper polishing plate which can rotate freely in the horizontal plane. These polishing plates are each covered with a polishing cloth, preferably by adhesive bonding, and, with continuous supply of a polishing slurry of suitable chemical composition. This enables the machine to provide double-side stock-removal polishing. The carriers have suitably dimensioned cutouts for holding the silicon wafers which, during the polishing, are held on a geometric path. This path is determined by machine and process parameters, for example a circular path or a cycloidal path. To achieve very high planarity values of the fully polished silicon wafers, a hypocycloidal or an epicycloidal path is particularly preferred. The carriers are in contact with the polishing machine by means, for example, of a pin wheel gear or an involute gear, via a rotating inner pin or gear ring and an oppositely rotating outer pin or gear ring. As a result they are set in rotary motion between the two oppositely rotating polishing plates.

In principle, the carriers used may be produced from any material which fulfills the following criteria: (1) It must present sufficient mechanical stability with respect to the mechanical stresses, primarily the compressive and tensile stresses, caused by pin wheel gear or involute gear drive and the polishing pressure. (2) It must have a high abrasion stability with a view to the very frequently repeated polishing operation under polishing conditions. (3) During the polishing, it must not release any significant quantities of metals which, under polishing conditions, i.e. in the alkaline medium at temperatures of from 20 to 50° C. and in the presence of an unprotected surface of the silicon wafer, may diffuse into the silicon lattice. Examples of metals of this type include nickel, copper and precious metals. (4) Furthermore, the material must be suitable for the production of highly planar, stress-free and undulation-free carriers of the desired thickness and geometry. Highly planar carriers are carriers which, within a set of carriers, for example five carriers, used at the same time during the double-side polishing have a thickness difference of preferably less than or equal to 5 $\mu$m, particularly preferably less than or equal to 3 $\mu$m.

Taking the listed conditions into account, in the context of the invention carriers made from stainless chromium steel without any addition of nickel or copper have proven particularly suitable. A steel which bears the German materials number 1.4034 ("X 46 Cr 13" according to its DIN abbreviated name), which in addition to iron contains 12.5–14.5% by weight chromium and 0.43–0.50% by weight carbon as alloying constituents, is particularly suitable. Corresponding steel grades are also available in some other manufacturing countries, bearing the grade designation which is valid for that country, for example under number 420 C in the United States of America.

The steel which is used for the carriers is generally procured in sheet form with a thickness which is slightly thicker, for example 10 to 100 $\mu$m thicker, than the carrier to be produced therefrom. The contour of the carriers is separated out of the steel sheet using processes which are customary in metal working, for example by sawing or laser cutting or cutting with a water jet. In the process, one or more preferably circular regions, which are intended to subsequently hold the silicon wafers, are removed from each carrier. Particularly preferably, protrusions for anchoring the injection-molded plastic remain in the cutouts for holding the silicon wafers. Moreover, an outer ring of gear teeth is produced, which comes into contact with the driving pin gear or involute gear rings of the polishing machine.

Preferably, further regions are removed, which remain unoccupied during the polishing in order to optimize the flow of polishing slurry and stopping agent. In this context, various, even irregular shapes are possible. Furthermore, the removal of further small, for example circular, regions may be appropriate for the purpose of subsequent positioning or position detection on the polishing machine. However, it is imperative that sufficiently wide webs of steel sheet remain untouched, in order not to endanger the mechanical stability of the carrier. Then, the carrier blanks which have been produced in this way are ground to the desired thickness by a grinding operation or a lapping operation, with the high planarities mentioned above being produced. Cleaning and, if appropriate, deburring, for example by machining or by electropolishing, then follows.

In the next steps for preparation for their use in double-side polishing, the highly planar, cleaned carrier metal bodies are firstly provided with at least one identification feature and then the cutouts for holding the silicon wafers are lined with plastic. However, the two steps may also be carried out in the reverse order without causing any disadvantages. The following demands are imposed on an identification feature applied in the context of the invention: (1) Each individual carrier must be unambiguously designated. If the type of carriers used has a plurality of cutouts for holding silicon wafers, it is desirable for these cutouts also to be provided with a distinguishing feature. (2) The identification feature must not have an adverse effect on the local planarity of the carrier in this region, for example by causing a bulge, an indentation or by the formation of burrs. Also it must not cause any damage to the silicon wafer or the polishing cloth during the polishing. (3) After the polishing is complete, the identification feature must be legible to the human eye and/or to an automated detection device.

Various technical options are available for fulfilling these requirements and are based on the one hand on using characters which can be read by the operator. For example there can be a sequence of numerals, letters and/or special symbols, or machine-readable coded script, for example a so-called bar code. On the other hand, there are the techniques of cutting out, for example by laser cutting, milling out or etching away carrier material, and all techniques are preferred. In the context of the invention, the principle of applying characters with a height of from 2 to 20 mm and an imprint depth of from 10 to 50 $\mu$m by electrochemical etching has proven suitable and is therefore particularly preferred. Each carrier is assigned an individual sequence of characters which contains information about the identity of the carrier set and preferably about the diameter and the intended final thickness of the silicon wafers to be polished, the number of the carrier in said carrier set and, if appropriate, further details. If the carriers contain a plurality of cutouts for holding silicon wafers, it is particularly preferably for consecutive numbers to be applied next to these carriers. Marking units which operate in such a manner that, as a result of electric current being applied in the presence of an electrolyte, using a stamp or a stencil, for example, metal is removed in a controlled manner, are commercially available for the electrochemical application of characters and sequences of characters to metal surfaces.

The carriers have one or more cutouts, preferably in circular form, for holding one or more silicon wafers. To prevent damage to the wafer edge caused by the inside of the cutout in the carrier during polishing, the inside of the cutouts is lined with a coating of the same thickness as the carrier wafer. The following conditions are imposed on this lining: (1) It must combine a sufficiently high mechanical and polishing stability with a sufficient softness to prevent damage to the edge of the silicon wafers during the polishing. (2) It must be chemically resistant under polishing conditions. (3) It must be inexpensive to apply and exchange.

These conditions are satisfied by various plastics, for example by polyamide (PA), polyethylene (PE), polypropylene (PP), polyvinyl chloride (PVC) and polyvinylidene difluoride (PVDF), which are all equally preferred. If appropriate, the plastics may contain reinforcing inert fillers, for example glass fibers or glass beads. To ensure free mobility of the silicon wafer in the cutout in the rotating carrier which has been lined with plastic in this way, the diameter of the lined cutout must be slightly larger than the silicon wafers to be polished. A diameter which is larger by 0.1 mm to 2 mm is preferred; and a diameter which is larger by 0.3 to 1.3 mm is particularly preferred. A process for applying plastic linings of this type using the extrusion principle is preferred. In this case, a plastic ring is produced in a heated injection mold of suitable geometry which geometry comprises the cutout in the carrier. This plastic ring is particularly preferably securely connected to the carrier on the outside via webs of the carrier and on the inside has a rectangular or rounded profile facing the silicon wafer.

Experience has shown that the metal body of the carriers has a service life of several thousand polishing runs or several thousand use hours in double-side polishing. By contrast, the plastic lining of the cutout represents a wearing part. After it has been used for a few hundred hours of polishing, parts may break out of the lining. Gradual degradation is also observed in certain cases, which may bind foreign particles, for example silicon dioxide ($SiO_2$) from a polishing slurry employed. In particular, a polished edge of the silicon wafer may, after excessively long use of the linings, be damaged by these effects, leading to the corresponding silicon wafers being rejected. Moreover, there is a significant risk of the front and/or back surface of the silicon wafers being scratched by parts which have become detached.

Therefore, in the context of the invention it is provided for the plastic linings of the cutouts to be replaced periodically. The replacement interval is dependent in particular on the process-related stresses and on the material of the linings. If unfilled plastics are used and if the preferred procedure for double-side polishing which is described below is carried out, replacement after a use period of 50 to 500 hours is preferred. This replacement may take place by manual removal of the lining and renewed application of plastic using the process described above. The wear to the linings can be established by visual or microscopic inspection, so that their duration of use in production can be optimized. It is preferable for all the data relating to the carriers with reference to the unambiguous identification to be recorded in an electronic database which is linked to a master computer which automatically stipulates the exchange intervals for the linings.

Before being used in double-side polishing, the carriers which have been prepared as described above are cleaned, preferably under the action of ultrasound in an aqueous bath which, if appropriate, may contain one or more additives, such as a surfactant. A commercially available ultrasound tank of suitable size is suitable for this purpose.

The carriers for the polishing process according to the invention have a preferred thickness of from 500 to 1000 $\mu$m, depending on the final thickness of the polished silicon wafers, which is ultimately dependent on the diameter of the silicon wafers and on the intended application. With a view to the fabrication of highly planar silicon wafers, it is preferable for the final thickness of the polished wafers to be 2 to 20 $\mu$m greater than the carrier thickness, the range from 3 to 10 $\mu$m being particularly preferred. Therefore, in order for the polishing times to be determined as precisely as possible, the carrier thickness should be periodically determined, for example with the aid of a scanner or a micrometer instrument. By means of the identification features of the carriers, this data can also be archived and administered in the database and linked to other carrier parameters. The removal of silicon brought about by the double-side polishing is preferably from 2 to 70 μm, particularly preferably from 5 to 50 μm.

In the context of the statements made with regard to the carriers and thickness ratios, the double-side polishing step is preferably carried out in the manner known to the person skilled in the art. The carriers belonging to a set and to be used in the polishing are initially placed onto the lower plate of the polishing machine in such a way that the identification features are facing upward and are therefore visible. Then, the silicon wafers are inserted into the cutouts in the carriers in a predetermined order, preferably beginning with the first cutout in the first carrier and ending with the final cutout in the final carrier, manually or with the aid of a machine.

Polishing is preferably carried out using a commercially available polyurethane polishing cloth with a Shore A hardness of from 50 to 100, which may have incorporated reinforcing polyester fibers if desired. In the case of the polishing of silicon wafers, a continuous supply of a polishing slurry with a pH of preferably 9 to 12 comprising preferably 1 to 5% by weight $SiO_2$ in water, is desirable with a polishing pressure of preferably from 0.1 to 0.3 bar, being recommended. The silicon removal rate is preferably 0.2 to 1 μm/min.

To end the polishing step, the chemically highly reactive, hydrophobic wafer surface has to be passivated. In the context of the invention, this preferably takes place by the supply of a liquid or a plurality of liquids in succession which contain one or more film-forming agents. This leads to the complete wetting of the polished front surface, back surface and edge of the silicon wafers with a film of liquid. A concentration range of between 0.01% and 10% by volume of film-forming agent in the stopping agent is generally appropriate. It is particularly preferable to use a substance or a plurality of substances which can be removed in a subsequent cleaning step and is/are selected from the group of compounds consisting of monohydric or polyhydric alcohols, polyalcohols and surfactants. An embodiment of the stopping operation which implements the same principle and is likewise particularly preferred is to supply an aqueous $SiO_2$-based polishing abrasive which contains one or more substances from these groups of compounds in proportions of from 0.01% to 10% by volume.

After the supply of stopping agent and, if appropriate, ultrapure water has ended, the silicon wafers are preferably removed from the polishing machine with the aid of a vacuum wand and are transferred into a wet tray filler. In the context of the invention, it is preferable for the silicon wafers to be removed from the polishing machine in a predetermined order using the identification features of the carriers and to be loaded into a wafer cassette in a wet buffer. Particularly preferably, the order of insertion is thus repeated. This means that the sequence of the silicon wafers has not undergone any change because of the polishing. This procedure in accurate sequence is highly important for wafer monitoring, for example in a completely continuous production process. Finally, the silicon wafers are cleaned and dried according to the prior art.

Next there is an assessment of the silicon wafers with regard to the quality features which are influenced by the polishing step and are specified by the further processor of the wafers, using methods which are known to the person skilled in the art. Features of this type may, for example, be local geometry data and wafer thickness. This data is determined on a commercially available measuring instrument which operates according to a capacitive or optical principle. The data is advantageously stored electronically in a database and is available for the statistical process control which is desired in a production environment. It is also possible and advantageous to produce a data link between measuring instrument, polishing machine and, if appropriate, carrier database via a master computer. As a result it is possible, for example during successive polishing runs with wafer material of the same type, by stipulating the starting thickness and target thickness of the silicon wafers, to automatically predetermine the polishing time for the subsequent polishing run by calculating the current removal rate. P Further quality features which are assessed may be properties relating to the front surface, the back surface and/or the edge of the wafers. Considerable importance is ascribed to the visual assessment of the occurrence and extent of scratches, haze, and other deviations from the ideal silicon surface under strongly focused light. Furthermore, by way of example, examinations of roughness, topology and metal contamination on commercially available measurement units may be suitable or required.

Depending on further intentions, it may be necessary for the wafer front surface to be subjected to surface polishing in order to achieve a haze-free polished front surface according to the prior art. For example this may be done by using a soft polishing cloth with the aid of an alkaline polishing slurry based on $SiO_2$, with from 0.1 to 1 μm of silicon being removed. If desired, a heat treatment of the silicon wafer may be added at a suitable point in the process sequence. For example this may be done in order to destroy thermal donors, to heal defects in crystal layers close to the surface or to bring about controlled dopant depletion. A series of further process steps required to create certain products may be carried out. For example, the application of back-surface coatings of polysilicon, silicon dioxide or silicon nitride, or the application of an epitaxial layer of silicon or further semiconducting materials to the front surface of the silicon wafer, using a process which is known to a person skilled in the art, may likewise be incorporated into the process sequence at suitable points.

With regard to the further parameters which are usually employed for wafer characterization, for example surface and edge defects, roughness, topology and metal contamination of the wafer surface, the silicon wafers produced according to the invention have no drawbacks when compared to silicon wafers which have been produced according to the prior art.

Semiconductor wafers which have been produced according to the invention, in particular silicon wafers, fulfill the requirements for the production of semiconductor components with line widths of less than or equal to 0.13 μm in very high yields. In particular, very high local planarities, expressed, for example, as $SFQR_{max}$ less than or equal to 0.13 μm, are achieved by using steel carriers which have very low thickness fluctuations and are only a few μm thinner than the fully polished semiconductor wafer. The production of unambiguous identification features on the carriers without the drawback of local deformations allows data-technology monitoring of the carrier utilization and polishing in accurate sequence. For example there are the inserting the semiconductor wafers into the polishing machine and the removing of them from the polishing machine in the same order. The periodic exchange of the injection-molded plastic linings of the carrier cutouts avoids damage in particular to the edges of the semiconductor wafers during the double-side polishing. This also increases

BRIEF DESCRIPTION OF THE DRAWINGS

Other objects and features of the present invention will become apparent from the following detailed description considered in connection with the accompanying drawings which disclose several embodiments of the present invention. It should be understood, however, that the drawings are designed for the purpose of illustration only and not as a definition of the limits of the invention.

In the drawing, wherein similar reference characters denote similar elements throughout the several views.

DETAILED DESCRIPTION OF PREFERRED EMBODIMENTS

EXAMPLE

The example relates to the double-side polishing of silicon wafers with a diameter of 300 mm on a production scale. The silicon wafers were fabricated in accordance with the prior art by wire sawing of a single crystal, edge rounding, double-side sequential surface grinding, etching in a concentrated nitric acid/hydrofluoric acid mixture and edge polishing and having a thickness of 805 $\mu$m.

Figure 1:
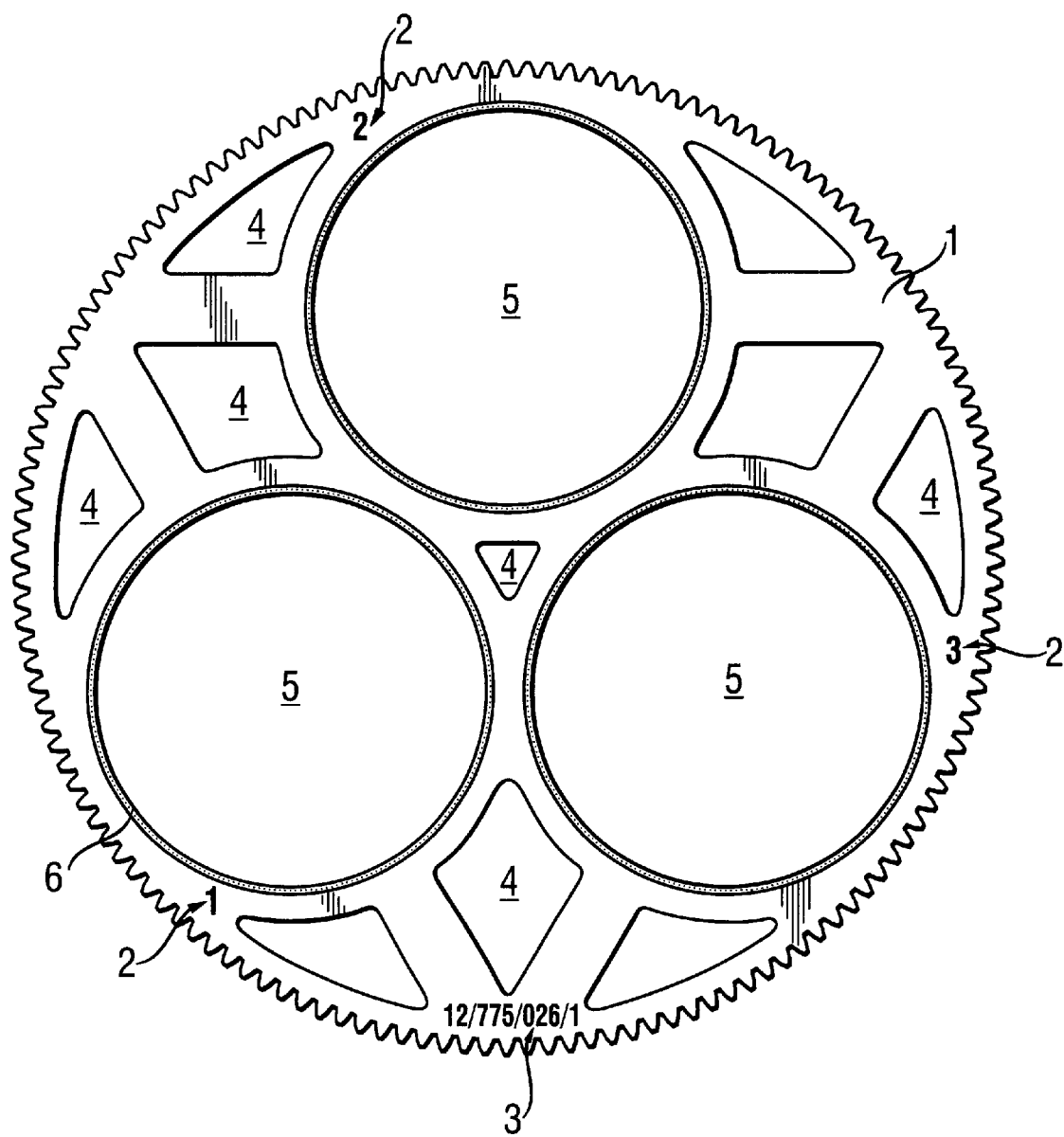
FIG. 1 shows a carrier for the double-side polishing of semiconductor wafers of diameter 300 mm according to the invention.
Figure 2:
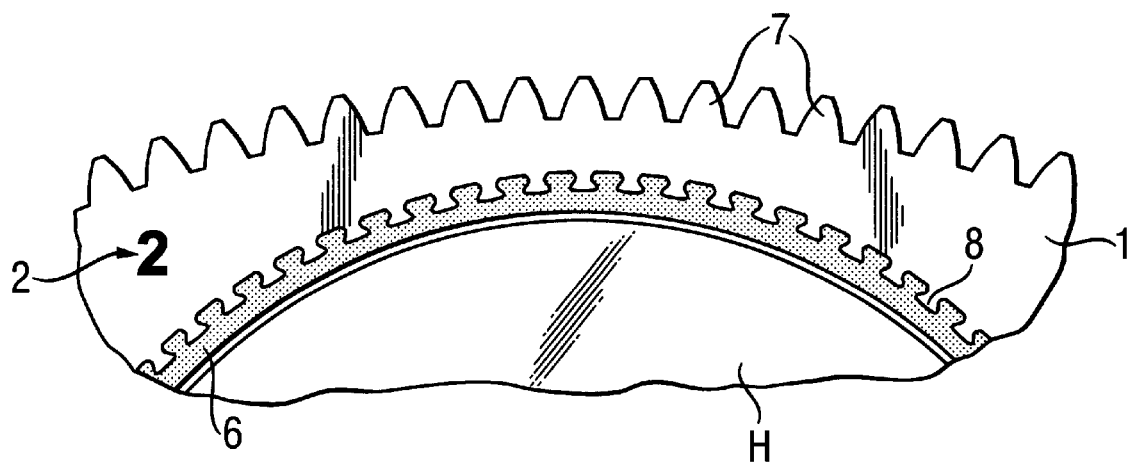
FIG. 2 shows an enlarged area from FIG. 1 in the region of the plastic lining of a cutout for semiconductor wafers.

Five carrier blanks were obtained in the form 1, the contour of which, illustrated in FIG. 1, had been produced by means of laser cutting from a chromium steel sheet (German materials number 1.4034) with a nominal thickness of 800 $\mu$m. As illustrated in FIG. 1 and FIG. 2, the carrier blanks were distinguished by each having three cutouts 5 for holding 300 mm silicon wafers. These cutouts 5 had projections 8 for anchoring the plastic lining, further cutouts 4 for improving the distribution of polishing abrasive, and an outwardly directed row of teeth 7 which were matched to the involute gear teeth of the polishing machine. The carriers were lapped in a suitably dimensioned lapping machine with the continuous supply of a lapping suspension containing abrasives, down to a target thickness of 772 $\mu$m, and were cleaned. Characterization of all regions of the five carriers using a thickness sensor showed that its mean thickness was 771 $\mu$m, with local deviations of less than or equal to 1 $\mu$m.

A commercially available marker unit of type SCRIPTO-GRAPH SG 150, produced by WHB-Beschriftungstechnik, which operates application of an unambiguous identification feature to the carrier. The procedure was that firstly a labeling unit included in the delivery was used to produce masks bearing the sequences of characters to be applied in a suitable size. These masks were attached to the appropriate point on the carrier metal body 1 using adhesive strips. The carrier steel was etched and marked in the region of the characters as a result of the application of electric current together with the action of a weakly acidic aqueous electrolyte solution which contained citric acid, sodium nitrate and sodium chloride. After the marking operation was over, the relevant region of the carrier was neutralized using a weakly alkaline aqueous solution based on sodium carbonate. The marking depth was 30 $\mu$m; it was not possible to detect any local deformation in this region of the carrier.

Figure 3:
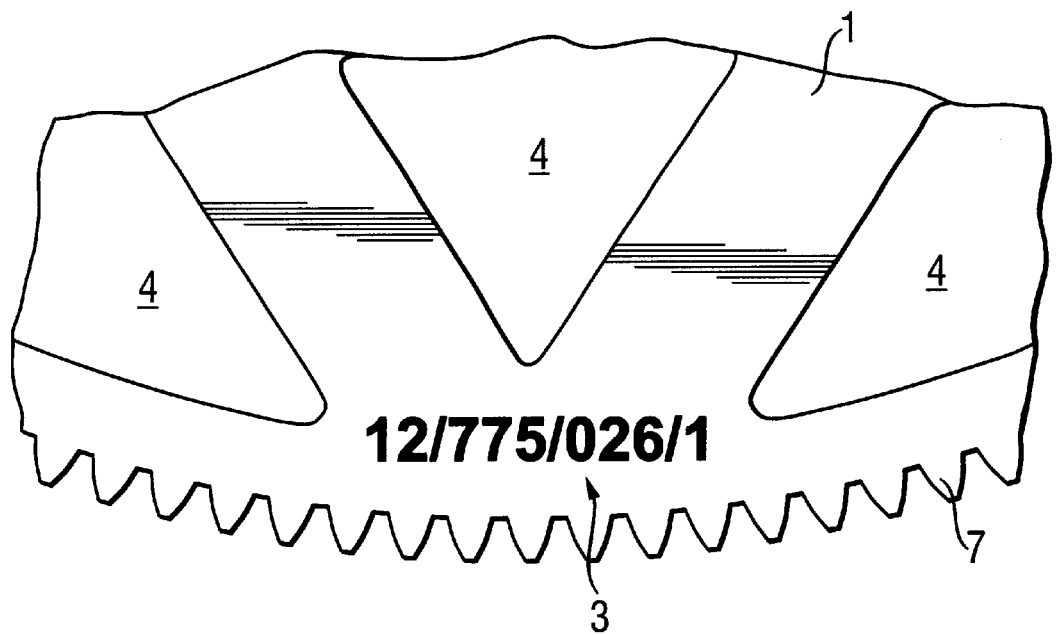
FIG. 3 shows an enlarged area from FIG. 1 in the region of the identification feature.

As can be seen in FIG. 1 and FIG. 3, the unambiguous identification feature comprised an individual carrier number with a character height of 8 mm and, in addition, consecutive numbers 2, with a character height of 12 mm, for identifying the cutouts 5 for holding silicon wafers. The individual carrier number 3 comprised four sequences of characters separated by slashes, and for the carrier illustrated in FIG. 1 and FIG. 3 read 12/775/026/1. In this sequence, 12 stands for the diameter of the silicon wafer to be polished in inches, 775 stands for the thickness of the silicon wafer after polishing in $\mu$m, 026 stands for the consecutive number of the carrier set comprising the five carriers, and 1 stands for the individual number of the relevant carrier in this set. The designation 2 of the cutouts 5 for holding silicon wafers used the numbers 1 to 3.

Then, with the aid of a suitably designed, heated injection mold, a plastic lining 6 which consists of PVDF, as illustrated in FIG. 1 and FIG. 2, was of the same thickness as the lapped carrier and on the outside was anchored by means of the carrier projections 8 and had a rectangular cross section on the side facing toward the edge of the silicon wafer, was introduced into each of the cutouts 5 by extrusion. The set 026 of five carriers which had been prepared in this way was cleaned in an ultrasound bath filled with an aqueous surfactant solution, was rinsed with ultrapure water and was dried.

Figure 4:
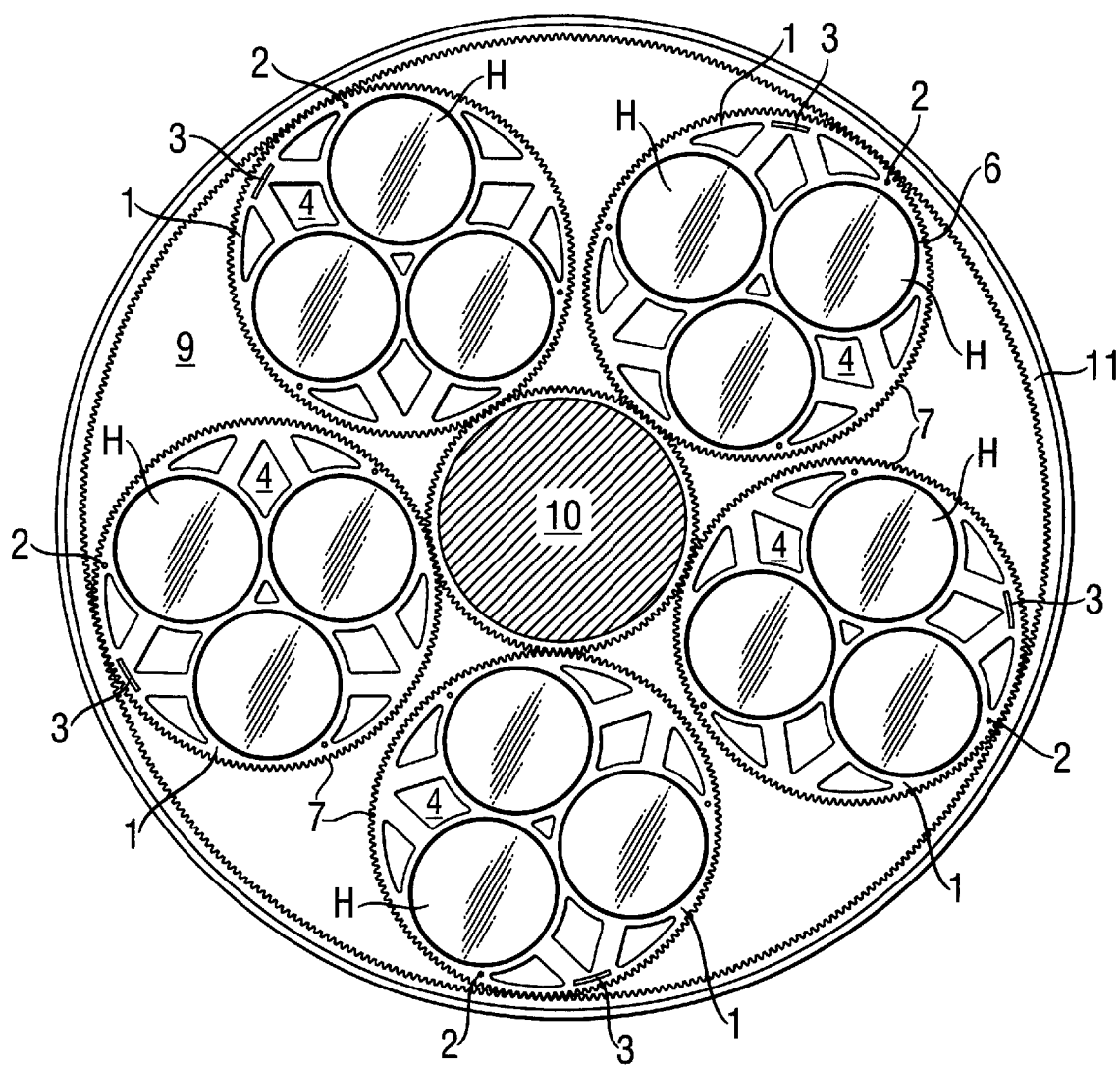
FIG. 4 shows the arrangement of a plurality of the wafers illustrated in FIG. 1 in a machine for the double-side polishing of semiconductor wafers.

As illustrated in FIG. 4, the five carriers were arranged on a commercially available machine for the double-side polishing of semiconductor wafers, with the markings 3 and 2 on the carriers facing upward and consequently being visible. The polishing machine substantially comprised an upper polishing plate (not shown) to which a polishing cloth had been adhesively bonded, a lower polishing plate 9 to which a polishing cloth had been adhesively bonded. There was an inner gear ring 10 and an outer gear ring 11, and this allowed the simultaneous double-side polishing of 15 semiconductor wafers H, in this case of silicon wafers of diameter 300 mm. The silicon wafers were supplied to the polishing machine in groups of 15 wafers in each case. In each polishing operation, these 15 silicon wafers in each case were inserted manually and continuously into the carriers using gloved fingers. In this manner, silicon wafer 1 was inserted into cutout 1 in carrier 12/775/026/1, silicon wafer 2 was inserted into cutout 2, etc., until silicon wafer 15 was inserted into cutout 3 of carrier 12/775/026/5.

A commercially available product comprising porous polyurethane foam with a Shore A hardness of 80 was used as polishing cloth. The polishing was carried out by rotating upper polishing plate and lower plate 9 in opposite directions, the temperature of both polishing plates having been regulated at 40° C. The inner gear ring 10 and outer gear ring 11 likewise rotating in opposite directions at the same time. An aqueous polishing slurry Levasil 200, produced by Bayer, with an $SiO_2$ solids content of 3% by weight and a pH set at 11.2 by potassium carbonate, was continuously supplied under a pressure of 0.125 bar. The mean removal rate was 0.59 $\mu$m/min.

After the thickness of the polished wafers reached 775 $\mu$m, the supply of the polishing slurry was terminated, corresponding to a silicon removal of 30 $\mu$m. In order to stop the polishing process the polishing slurry was replaced by the liquids listed below being supplied sequentially, while maintaining rotational conditions: (1) 2% strength by weight mixture of the polishing slurry Glanzox 3900, produced by Fujimi, with ultrapure water (3 min; 0.04 bar); (2) ultrapure water (2 min; 0.02 bar); (3) aqueous solution of 1% by volume glycerol, 1% by volume n-butanol and 0.07% by volume of the surfactant Silapur (alkylbenzenesulfonic acid/amine ethoxylate, produced by ICB; 2 min; 0.02 bar). After the upper polishing plate had been raised and pivoted away, the front surfaces of the fully polished silicon wafers positioned in the carrier cutouts were completely wetted with stopping liquid.

A vacuum wand which was provided with a handle, consisted of polypropylene and had three suction cups made from soft PVC, was available for removing the silicon wafers from the polishing machine. Moreover, a commercially available 300 mm wet buffer filler for receiving the polished silicon wafers was available and filled with ultrapure water. The procedure was that the carriers were left in position during the removal of the wafers, and the wafers were removed and transferred into the wet buffer filler individually with the aid of the vacuum wand. In the process, the silicon wafers, using orientation based on the carrier markings 2 and 3, were removed from the machine in the same order as that in which they had been inserted prior to the polishing, i.e. beginning with the cutout 1 in carrier 12/775/026/1 and ending with cutout 3 in carrier 12/775/026/5, and were accordingly introduced into a wafer cassette in the wet buffer in the original order. The silicon wafers were then cleaned and dried in a batch process according to the prior art.

In this way, the double-side polishing of 300 mm silicon wafers took place in a continuous process using the set of carriers 026. In the used polishing slurry, which was periodically checked for metal contamination, it was not possible to detect any significantly increased levels of the metals copper and nickel which are harmful under process conditions. After it had been used for in each case 250 polishing runs, this carrier set 026 was removed from production and replaced by a carrier set of the same type. The plastic linings of carrier set 026 were removed and renewed by further injection molding of PVDF in the same way as that used prior to initial use. After cleaning under the action of ultrasound and drying, carrier set 026 was available again for polishing. The procedure described in total allowed carrier set 026 to be used for several thousand polishing runs.

The 300 mm silicon wafers which had been polished in this way, with a polished front surface, a polished back surface and a polished edge, were characterized in a manner which is customary to the person skilled in the art. A geometry measurement on a geometry-measuring unit which operates according to the capacitive principle showed a local flatness $SFQR_{max}$ of $(0.10\pm0.03)$ $\mu$m for a surface grid of 25 mm×25 mm. Topological measurement by means of a laser beam revealed high plane-parallelism even in the edge region without the occurrence of distinctive topological features. A visual inspection under strongly focused light in a darkened inspection chamber revealed a very clean surface with very considerable absence of scratches and haze on surface and edge. A VPD-TXRF measurement of the surface metals determined typical values of less than or equal to $10^9$ atoms per $cm^2$ for example for iron, nickel, copper and chromium. The surface roughness RMS (root mean square) determined using an optical measuring unit utilizing the phase difference of a linearly polarized, split laser beam, a part beam being reflected from the wafer surface, was on average 0.02 nm (measurement area 10 $\mu$m×10 $\mu$m) or 0.30 nm (measurement area 250 $\mu$m×250 $\mu$m).

Accordingly, while a few embodiments of the present invention have been shown and described, it is to be understood that many changes and modifications may be made thereunto without departing from the spirit and scope of the invention as defined in the appended claims.

What is claimed is:

1. A process for the double-side polishing of semiconductor wafers between two polishing plates which rotate in opposite directions and are covered with polishing cloth, so that at least 2 $\mu$m of semiconductor material is removed; placing the semiconductor wafers in plastic-lined cutouts in a set of a plurality of planar carriers which are made from steel and the mean thickness of which is 2 to 20 $\mu$m smaller than the mean thickness of the fully polished semiconductor wafers;

the set comprises only those carriers whose difference in thickness is at most 5 $\mu$m, and each carrier belonging to the set has at least one unambiguous identification feature which assigns it to the set; and an item of information contained in the identification feature is used in order for the plastic linings to be exchanged at fixed intervals and to ensure that the semiconductor wafers remain in the same order after the polishing as before the polishing.

2. The process as claimed in claim 1, wherein the set comprises only those carriers whose difference in thickness is at most 3 $\mu$m, the mean thickness of the carriers is 3 to 10 $\mu$m smaller than the mean thickness of the fully polished semiconductor wafers, and the amount of semiconductor material removed is from 5 to 50 $\mu$m.

3. The process as claimed in claim 1, wherein at least three semiconductor wafers are polished simultaneously and at least three carriers are used simultaneously.

4. The process as claimed in claim 1, wherein the cutouts are lined with plastic by an extrusion process and are exchanged after they have been used for double-side polishing for from 50 to 500 hours.

5. The process as claimed in claim 1, wherein the carriers, before they are used for the first time for double-side polishing, have been planarized by an operation selected from the group consisting of a lapping operation, a grinding operation and a lapping plus grinding operation, and have been cleaned in an aqueous bath under the action of ultrasound.

6. The process as claimed in claim 1, wherein during the double-side polishing of the semiconductor wafers a lower and upper polishing cloth which substantially comprises polyurethane and has a Shore A hardness of from 40 to 120 is used, and a polishing abrasive with a $SiO_2$ solids content of from 1 to 5% by weight and a pH of from 9 to 12 is continuously supplied.

7. The process as claimed in claim 1, wherein the semiconductor wafers are produced by sawing up a semiconductor crystal followed by a step selected from the group consisting of rounding of the edges, grinding, lapping, wet chemical etching, and a combination thereof.

8. A carrier made from steel used for the double-side polishing of semiconductor wafers on both sides comprising
at least one plastic-lined cutout for holding a semiconductor wafer; and
said carrier having at least one identification feature which unambiguously characterizes the carrier and has been produced by local removal of steel.

9. The carrier as claimed in claim 8,
wherein the identification feature assigns the carrier to a set of carriers.

10. The carrier as claimed in claim 8,
wherein the identification feature contains an item of information which characterizes the cutout.

11. The carrier as claimed in claim 9,
wherein the identification feature has been produced by electrochemical etching.

12. The carrier as claimed in claim 9,
wherein the plastic for lining the cutout consists of a material which is selected from the group consisting of polyalkanes, polyamide, polyvinyl chloride and polyvinylidene difluoride, and mixtures and copolymers of these compounds.

13. The carrier as claimed in claim 9,
which has additional cutouts for improving the distribution of polishing abrasive.

14. A semiconductor wafer made from silicon with a local planarity $SFQR_{max}$ of less than or equal to 0.13 μm, based on a component area of 25 mm×25 mm, and
produced by the process as claimed in claim 1.

* * * * *